(12) United States Patent
Gerlach et al.

(10) Patent No.: US 6,499,128 B1
(45) Date of Patent: Dec. 24, 2002

(54) ITERATED SOFT-DECISION DECODING OF BLOCK CODES

(75) Inventors: Derek Gerlach, Mountain View, CA (US); Richard Koralek, Palo Alto, CA (US); Vincent K. Jones, Redwood Shores, CA (US); Gregory G. Raleigh, El Granada, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/253,146

(22) Filed: Feb. 18, 1999

(51) Int. Cl.$^7$ ............................................. H03M 13/00
(52) U.S. Cl. ................. 714/755; 714/758; 714/780; 714/786; 714/795; 375/341
(58) Field of Search ................. 714/746, 752, 714/755, 758, 760, 777, 780, 783, 786, 793, 794, 795, 796; 375/262, 341

(56) References Cited

U.S. PATENT DOCUMENTS

| | | | |
|---|---|---|---|
| 5,181,209 A | | 1/1993 | Hagenauer et al. .......... 714/795 |
| 5,185,747 A | * | 2/1993 | Farahati ....................... 714/795 |
| 5,406,570 A | | 4/1995 | Berrou et al. ................ 714/792 |
| 5,414,738 A | * | 5/1995 | Bienz .......................... 375/341 |
| 5,446,747 A | | 8/1995 | Berrou ......................... 714/788 |
| 5,537,444 A | | 7/1996 | Nill et al. .................... 375/341 |
| 5,563,897 A | | 10/1996 | Pyndiah et al. ............. 714/755 |
| 5,721,745 A | * | 2/1998 | Hladik et al. ................ 714/755 |
| 5,729,560 A | | 3/1998 | Hagenauer et al. .......... 714/786 |
| 5,930,272 A | * | 7/1999 | Thesling ....................... 714/752 |
| 5,944,850 A | * | 8/1999 | Chouly et al. .............. 714/790 |
| 6,061,823 A | * | 5/2000 | Nara ........................... 714/758 |
| 6,161,209 A | | 12/2000 | Moher ......................... 714/780 |
| 6,167,552 A | * | 12/2000 | Gagnon et al. ............. 714/793 |

OTHER PUBLICATIONS

Benedetto et al. "Guest Editorial Concatenated Coding Techniques and Iterative Decoding: Sailing Toward Channel Capacity", Feb. 1998, IEEE, vol. 16, No. 2.
Hagenauer et al., "Iterative Decoding of Binary Block and Convolutional Codes", Mar. 1996, IEEE, vol. 42, No. 2.
Gerard Battail, "A Conceptual Framework for Understanding Turbo Codes", Feb. 1998, IEEE, vol. 16, No. 2.

\* cited by examiner

*Primary Examiner*—Emmanuel L. Moise
(74) *Attorney, Agent, or Firm*—Ritter, Lang & Kaplan LLP

(57) ABSTRACT

Systems and methods for augmenting the performance of iterative soft decision-in soft decision-out decoding of block codes with extrinsic information based on multiple parity equations inherent to the block codes. Cyclic shifting of codewords may be applied in the context of iterative soft decision-in soft decision-out decoding to maximize the usefulness of a parity equation corresponding to any particular codeword bit. Soft decisions are determined on a bit-by-bit basis in response to multi-bit symbol measurements. This allows the use of relatively inexpensive bit-based decoders for decoding of multi-bit symbols.

34 Claims, 9 Drawing Sheets

$$\begin{array}{ccccccc}
d_{00} & d_{01} & d_{02} & d_{03} & p_{04} & p_{05} & p_{06} \\
d_{10} & d_{11} & d_{12} & d_{13} & p_{14} & p_{15} & p_{16} \\
d_{20} & d_{21} & d_{22} & d_{23} & p_{24} & p_{25} & p_{26} \\
d_{30} & d_{31} & d_{32} & d_{33} & p_{34} & p_{35} & p_{36} \\
p_{40} & p_{41} & p_{42} & p_{43} & p_{44} & p_{45} & p_{46} \\
p_{50} & p_{51} & p_{52} & p_{53} & p_{54} & p_{55} & p_{56} \\
p_{60} & p_{61} & p_{62} & p_{63} & p_{64} & p_{65} & p_{66}
\end{array}$$

ITERATED SOFT-DECISION DECODING OF BLOCK CODES

BACKGROUND OF THE INVENTION

The present invention relates to digital communication and storage systems and more particularly to systems and methods for error control.

Error correcting codes insert redundancy into digital information streams so as to reduce susceptibility to noise. Applying an error correcting code at the transmitter permits the receiver to detect and sometimes correct errors induced by noise and/or interference. Some popular types of error correcting codes include convolutional codes, block codes, and Reed Solomon codes, etc.

An important recent development in the topic of error correcting codes is the discovery of "turbo" codes. These codes typically involve an iterated combination of two or more systematic convolutional codes (codes where the encoder output bits include unaltered input bits.) A key feature of turbo codes is the use of an iterated decoding technique where each successive decoding step outputs soft decisions usable as input to the next decoding step. By employing turbo codes, one may approach the limit of channel capacity in the presence of noise set by the Shannon theorem.

Further work has been done to exploit similar iterated combinations as applied to systematic block codes. See Hagenauer, Iterative Decoding of Binary Block and Convolutional Codes, IEEE Transactions on Information Theory, Vol. 42, No. 2 (March 1996), the contents of which are herein incorporated by reference. What is needed are decoding techniques that allow even closer approach to the limit without undue increase in complexity. It is furthermore desirable to implement the decoder with inexpensive components to the extent possible.

SUMMARY OF THE INVENTION

In one embodiment, the present invention augments the performance of iterative soft decision-in soft decision-out decoding of block codes with the use of information based on multiple parity equations inherent to the block codes. Another aspect of the present invention employs cyclic shifting of codewords in the context of iterative soft decision-in soft decision-out decoding to maximize the usefulness of a parity equation corresponding to any particular codeword bit. Yet another aspect of the present invention determines soft decisions on a bit-by-bit basis in response to multi-bit symbol measurements. This provides more coding gain than symbol-by-symbol soft decisions.

According to a first aspect of the present invention, a signal processing system includes a receiver system that receives a series of codewords that have been coded according to an iterative block coding procedure, and a decoder that decodes the series of codewords according to an iterative decoding procedure. At least one iteration of the decoding procedure forms estimates of codeword bits based in part on at least two parity equations inherent to a block code employed in the iteratively applied block coding procedure.

According to a second aspect of the present invention, a method for estimating bit-by-bit soft decision value in a digital communication system where multibit symbols are communicated is provided. The method includes receiving a multibit symbol, for a particular bit of the multibit symbol, evaluating a first Euclidean distance between the multibit symbol and a closest ideal symbol for which the particular bit has value "1", evaluating a second Euclidean distance between the multibit symbol and a closest ideal symbol for which the particular bit has value "0", determining a soft decision value for the particular bit based on the first Euclidean distance and the second Euclidean distance, and using the soft decision value as a basis for an iterative decoding process.

Other features and advantages of the invention will become readily apparent upon review of the following detailed description in association with the accompanying drawings.

DESCRIPTION OF SPECIFIC EMBODIMENTS

The present invention will be described to specific embodiments. It will be understood that the procedures described herein may be implemented with any kind of hardware including, e.g., ASICs, custom VLSI, FPGAs, etc., any kind of software including, e.g., C, assembly language, assembly language for DSP processors, etc., or any combination of digital or analog hardware or software.

Exemplary Data Communication System

Figure 1:
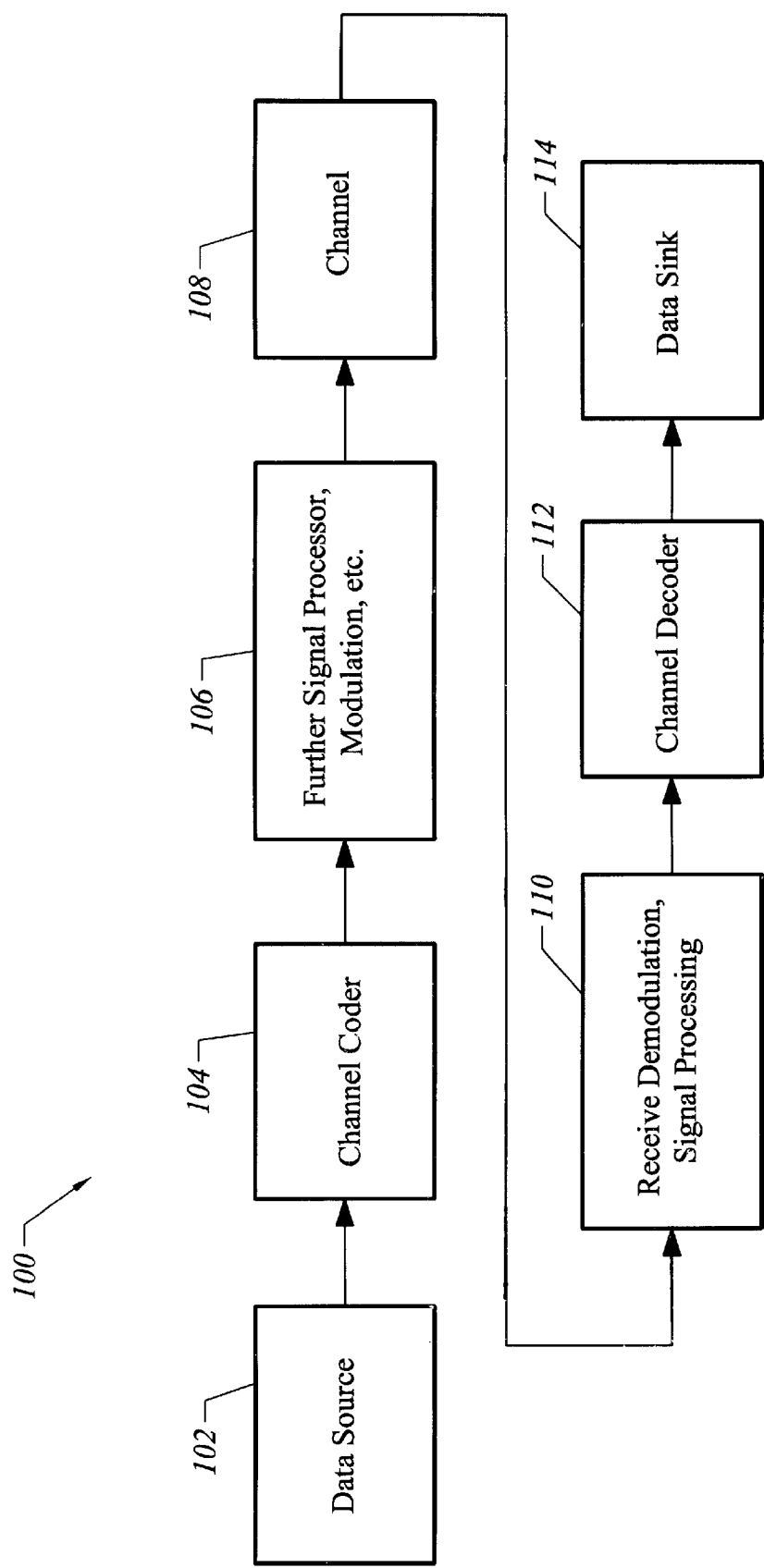
FIG. 1 depicts an exemplary data communication system.

FIG. 1 depicts an exemplary communication system 100 that may take advantage of the coding and decoding systems and methods provided by the present invention. A data source 102 originates data to be communicated. To improve quality of reception, the data is encoded by a channel coder 104. Prior to transmission across a channel 108, the channel coded data may be subject to further signal processing and is modulated onto a carrier by a transmission signal processing element 106. The carrier is appropriate to channel 108. The present invention is not limited to any modulation scheme but may operate in conjunction with, e.g., QAM, OFDM, CDMA, etc.

On a receiver end of channel 108, a receiver signal processing element 110 demodulates channel coded data received from the channel and may apply further processing. The input to a channel decoder 112 represents estimates of the output of channel coder 104. The channel decoder 112 uses the coded data to form estimates of the data provided by data source 102 and sends these estimates to a data sink 114.

Data source 102 may incorporate source coding for compression. The effect of such source coding may be removed by a matching source decoder within data sink 114.

Channel 108 may be any kind of channel including any type of transmission medium including, e.g., a wireless transmission medium, fiber optics, cable, twisted pair, telephone line, etc. Channel 108 may also represent storage and later retrieval of data such as from a magnetic or optical storage medium. Channel 108 may also include components such as antennas, filters, amplifiers, etc.

Serial Concatenated Block Coding

Figure 2:
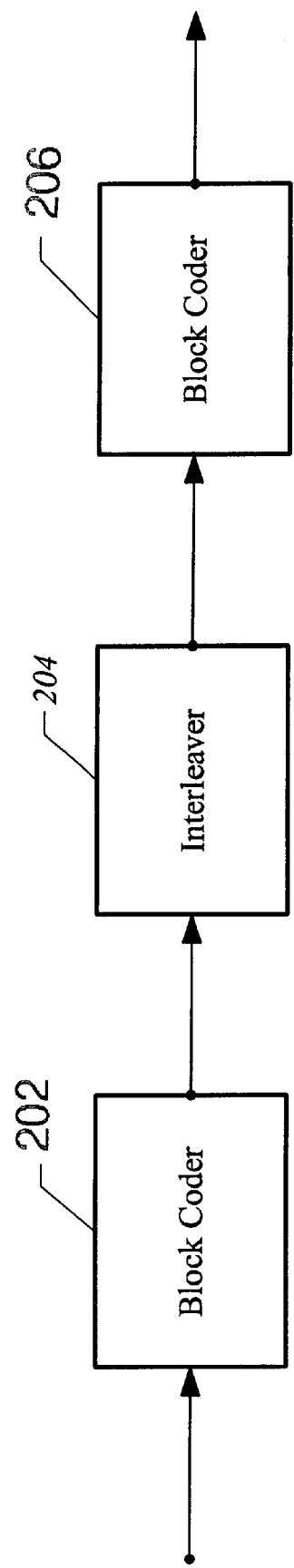
FIG. 2 depicts an exemplary serial concatenated block coder according to one embodiment of the present invention.

Channel coder 104 adds redundancy to the received data to facilitate error-free transmission. One channel coding scheme is a serial combination of block coders to form a so-called product code. FIG. 2 depicts an exemplary serial concatenated block coder 200 that may be used to implement channel coder 104.

A first block coder 202 applies a block code according to a first block coding scheme. Examples of possible block coding schemes include, e.g., Hamming codes, Reed-Solomon codes, etc. The block coding scheme employed is preferably a so-called "systematic code." This means that the output of block coder 202 is a stream of codewords where each codeword includes one or more data bits from the input and one or more parity bits which are obtained by block coder 202 based on the input.

An interleaver 204 interleaves the codewords output by block coder 202 according to an interleaving scheme. Many interleaving schemes are well known in the art such as e.g., block, helical, convolutional, or pseudo-random, etc. Interleaving schemes are described in, Wicker, Error Control Systems for Digital Communication and Storage (1995), the contents of which are herein incorporated by reference.

After interleaver 204, a second block coder 206 applies a second block coding scheme to the interleaver output to provide a second stream of codewords as the output of channel coder 104. Block coder 206 may implement the same block coding scheme as block coder 202 or a different block coding scheme.

The overall operation of serial concatenated block coder 200 may be referred to product coding. The operation of product coding will be explained in greater detail with reference to FIG. 3.

Figure 3:
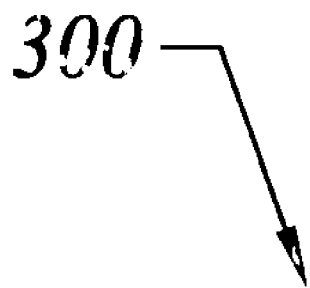
FIG. 3 depicts a product code as would be implemented by the serial concatenated block coder of FIG. 2 according to one embodiment of the present invention.

FIG. 3 depicts an array 300 of codewords as would be present at the output of serial concatenated block coder 200 if interleaver 204 employs a block interleaving scheme with a (7,4) code, i.e., a code that outputs codewords including 4 input data bits and 3 parity bits. In this arrangement, $d_{rc}$ are data bits and $p_{rc}$ are parity bits, with the subscript r denoting the row and c denoting the column. The first four rows of the matrix each represent a codeword output by first block coder 202. Each column represents a codeword output by second block coder 206. The first coding scheme employed by first block coder 202 may be referred to as the row code. The second coding scheme employed by second block coder 206 may be referred to as the column code.

In the depicted example, the input to first block coder 202 is the submatrix defined by the intersection of the first four rows and the first four columns. The output of first block coder 202 corresponds to the first four rows in their entirety. The operation of interleaver 204 causes the input to block coder 206 to be presented serially but column-by-column. The parity bits in the lower right corner are column-code-parity computed on the row code's parity. The row code and the column code need not be the same code; if they are of different block lengths, the matrix is rectangular rather than square. According to the present invention, at least one of the row code and the column code may employ multiple parity bits. In the depicted example, each code employs 3 parity bits.

A similar effect may be produced with different interleaving schemes although the results would not be visualized in the same way. It will be appreciated that further intereavers and block coders may be serially concatenated to the arrangement shown in FIG. 2. The effect is to add "dimensions" to the two dimensional scheme depicted in FIGS. 2–3.

Decoding the Serial Concatenated Coding Scheme

For a two-dimensional product code arrangement, decoding may proceed by first decoding the rows, then using the corrected rows as input for decoding the columns. This procedure can be iterated, resulting in the correction of additional errors. It will be appreciated that such a decoding scheme may be extended to multiple dimensions.

According to one embodiment of the present invention, a decoding scheme may take advantage of so-called soft decisions for bit values both at the input and at successive decoding iterations. A soft decision for a bit value is not simply a "0" or a "1" but rather an estimate of the likelihood that the bit has been transmitted as either a "0" or a "1."

According to one embodiment of the present invention, the decoding scheme may take advantage of relationships between the parity bits and data bits that are imposed by the particular block coding schemes used.

Certain decoding schemes provided by the present invention may be more readily understood in light of background information concerning the relationships between parity bits and data bits. Many popular block codes, e.g., BCH codes including Hamming codes and Reed-Solomon codes are linear codes. A linear code is the null space of a matrix H, known as the parity check matrix. For BCH codes, the H matrix has a specific well-defined structure. For example, the H matrix for a binary systematic Hamming code with block length n has the structure:

$$H=[\alpha^{n-1}\alpha^{n-2}\alpha^{n-3}\ldots\alpha^3\alpha^2\alpha 1]$$

where $\alpha$ is a primitive element of the finite field $GF(2^m)$, $n \leq 2^m-1$. Other BCH codes (including Reed-Solomon codes) have comparable structures. However, more generally, any linear code can be described by an H matrix. The rows of the H matrix define a set of parity equations that describe the inter-relationships between the bits of a codeword imposed by the code structure. A further discussion of block coding theory may be found in Wicker, Error Control Systems for Digital Communication and Storage (1995), the contents of which are herein incorporated by reference. According to the present invention, interrelationships provided by the parity check matrix may be explicitly used to develop multiple estimates of a given code bit.

A specific example will now be used to illustrate the application of the parity equations to iterative soft decision decoding according to one embodiment of the present invention. Consider the (7,4) Hamming code. The H matrix for this code is:

$$H = \begin{bmatrix} 1 & 1 & 1 & 0 & 1 & 0 & 0 \\ 0 & 1 & 1 & 1 & 0 & 1 & 0 \\ 1 & 1 & 0 & 1 & 0 & 0 & 1 \end{bmatrix}$$

Denote the 7 bits in a codeword as $x_6$, $x_5$, $x_4$, $x_3$, $x_2$, $x_1$, and $x_0$. This H matrix defines the following parity check equations:

$$x_6 \oplus x_5 \oplus x_4 \oplus x_2 = 0$$

$$x_5 \oplus x_4 \oplus x_3 \oplus x_1 = 0$$

$$x_6 \oplus x_5 \oplus x_3 \oplus x_0 = 0$$

where $\oplus$ signifies modulo-2 addition. From these equations, a number of bit inter-relationships can be inferred. For example, given a codeword, the following relationships can be seen for $x_6$:

$$x_6 = x_5 \oplus x_4 \oplus x_2$$

$$x_6 = x_5 \oplus x_3 \oplus x_0$$

Given estimates of all the bits in the codeword, we thus have 3 independent estimates of bit $x_6$, namely $x_6$ itself plus the preceding 2 equations.

The soft decision value for each bit is preferably proportional to the logarithm of the likelihood ratio for that bit, e.g., the value of the likelihood that a "1" was transmitted for that bit over the likelihood that a "0" was transmitted. According to one embodiment of the present invention, one may refine the soft decision value estimate for a particular bit with information provided by parity equations.

Each parity equation may provide a supplemental soft decision value for bit $x_6$. For each parity equation, we estimate the supplemental soft decision value to be the log-likelihood ratio for the value given the right side of the parity of equation. Thus, it is desirable to compute the log likelihood ratio for an exclusive -or of a number of bits, given the log likelihood ratios of each of the bits individually. The log likelihood ratio for a modulo-2 sum of 2 bits (say, $x_i \oplus x_j$, with log likelihood ratios $L(x_i)$ and $L(x_j)$) is approximately given by:

$$L(x_i \oplus x_j) \approx \mathrm{sgn}(L(x_i)) \cdot \mathrm{sgn}(L(x_j)) \cdot \min(|L(x_i)|, |L(x_j)|).$$

According to the present invention, this result may be extended to more than two bits. By induction, it can be shown that the log likelihood ratio of a modulo-2 sum of several bits is approximately given by the product of the signs of the log likelihood ratios of the individual bits times the minimum of the magnitudes of the log likelihood ratios of the individual bits. (Note that the sign of the log likelihood ratio of a bit is simply the so-called hard decision for that bit.)

Considering again $x_6$ as an example, there are 3 ways of estimating the likelihood ratio of $x_6$, namely $L(x_6)$, $L(x_5 \oplus x_4 \oplus x_2)$, and $L(x_5 \oplus x_3 \oplus x_0)$ We then have:

$L(x_6)$=the soft decision value of bit $x_6$ $L(x_5 \oplus x_4 \oplus x_2) = \mathrm{sgn}(L(x_5)) \cdot \mathrm{sgn}(L(x_4)) \cdot \mathrm{sgn}(L(x_2)) \cdot \min(|L(x_5)|, |L(x_4)|, |L(x_2)|)$ $L(x_5 \oplus x_3 \oplus x_0) = \mathrm{sgn}(L(x_5)) \cdot \mathrm{sgn}(L(x_3)) \cdot \mathrm{sgn}(L(x_0)) \cdot \min(|L(x_5)|, |L(x_3)|, |L(x_0)|)$ In these equations, $L(x_i)$ is the soft decision value for bit $x_i$. The values of $L(x_5 \oplus x_3 \oplus x_0)$ and $L(x_5 \oplus x_3 \oplus x_0)$ are referred to herein as extrinsic information and provide independent supplemental estimates of the log likelihood ratio of $x_6$ in addition to $L(x_6)$. An extrinsic value is then obtained as some combination of $L(x_5 \oplus x_3 \oplus x_0)$ and $L(x_5 \oplus x_3 \oplus x_0)$ and may then be used as a priori information that is input into the next stage of decoding. Because of the interleaving between the constituent codes, the extrinsic information at a given stage in the iterative decoding process provides new and independent information to the next stage.

According to one embodiment of the present invention, multiple parity equations are exploited in forming soft decision estimates. Also, according to the present invention one may take advantage of the extrinsic information in various ways to form input for the next decoding step. An extrinsic value $E(x_i)$ may be formed as a weighted or non-weighted sum of the supplemental soft decision values generated in accordance with the parity equations as explained above. In a given decoding step, the new soft decision value $L'(x_i)$ may be determined based on various combinations of the pre-decoding soft decision value and the extrinsic value generated based on the parity equations.

For example, one could apply the formula $L'(x_i) = L(x_i) + \alpha \cdot (E(x_i))$ for some parameter $\alpha$. The parameter $\alpha$ may be optimized to improve performance. Alternatively, one may apply the formula $L'(x_i) = \beta \cdot L(x_i) + \alpha \cdot (E(x_i))$ for a pair of parameters $\alpha$ and $\beta$. According to the present invention, these decoding techniques may be applied iteratively for the two or more block codes employed in the serial coding scheme.

In one embodiment, the values of $\alpha$ and/or $\beta$ may vary on a per iteration basis. For example, the value of $\alpha$ may be a function of the decoding iteration number, k so that $$L'(x_i) = L(x_i) + \alpha(k) \cdot (E(x_i))$$

or $$L'(x_i) = \beta \cdot L(x_i) + \alpha(k) \cdot (E(x_i))$$

In the original iteration, the previous soft decision value $L(x_i)$ may be obtained from the output of receive signal processing element 110. Where the output of receive signal processing element 110 is in the form of multi-bit symbol soft decision estimates, a constellation bit mapping technique described with reference to FIGS. 7–8 may be used to obtain the original soft decision value for each bit.

Thus, in any one iteration, a soft decision value is output for each bit. For bits where no parity information is available, the soft decision output value may be the same as the soft decision input value. For bits where parity information is available, one may take advantage of any of the above techniques to refine the input soft decision value with extrinsic information.

Another variation provided by the present invention takes advantage of the cyclic symmetry of many block codes including all Hamming codes and BCH codes. In a cyclic code, cyclically shifting any codeword results in another codeword. In the example above, it can be seen that $x_6$, $x_4$, and $x_3$ are each involved in 2 parity equations, while $x_5$ appears in all 3 parity equations. This implies that there is more extrinsic information available for bit $x_5$ than for the other bits. This property can be exploited by making use of the cyclic property of the code. Therefore, the codeword can be cyclically shifted, 1 bit at a time, so that each bit in turn is placed into the $x_5$ position for decoding. With this technique, each bit will have the maximum possible amount of extrinsic information to be combined into a priori information for the next iteration.

Equivalently, the H matrix rows can be cyclically shifted, resulting in a cyclically-shifted set of parity equations such that each bit appears in a set of 3 equations. This technique may simplify a serial implementation of the decoding implementation, since a single set of extrinsic calculators (corresponding to 1 bit's parity equation set) can be used and the bits cycled through it.

Figure 4:
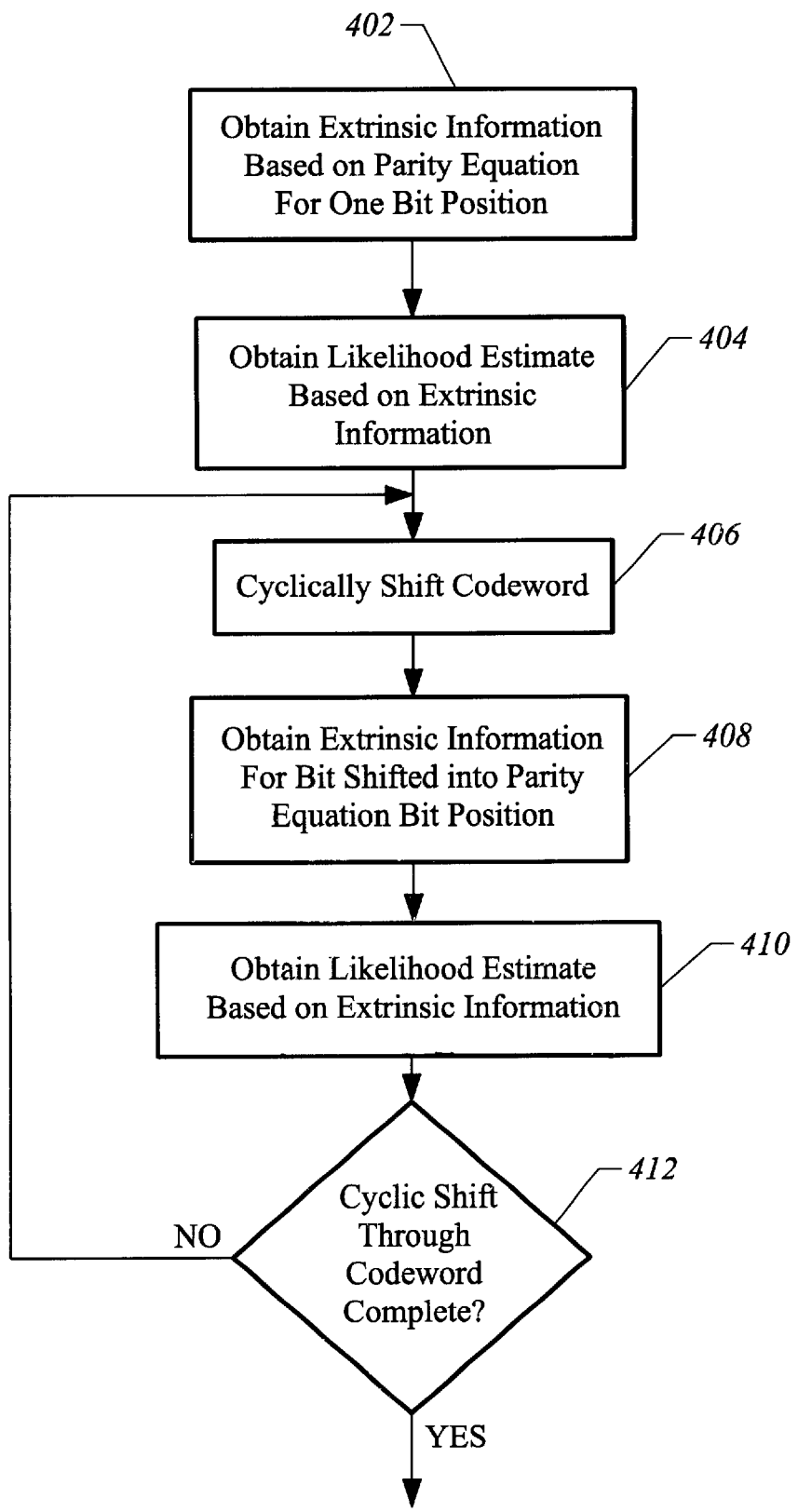
FIG. 4 depicts a procedure for cyclically shifting codewords to augment extrinsic information available from parity equations according to one embodiment of the present invention.

FIG. 4 depicts a procedure for cyclically shifting codewords to augment extrinsic information available from parity equations according to one embodiment of the present invention. At step 402, extrinsic information is obtained for a designated bit position of a codeword based on the parity equations for that bit position. This designated bit position is preferably chosen to be the one having the maximum parity information. At step 404, the new soft decision value for the bit in the designated bit postion is obtained based on a combination of the extrinsic information and possibly the previously obtained soft decision value for that bit by any of the methods described above. At step 406, the codeword is cyclically shifted by one bit so that a new bit shifts into the designated bit position. At step 408, extrinsic information is obtained for the bit shifted into the designated bit position. At step 410, a new soft decision value is generated for this bit. Step 412 tests whether cyclic shifting through the codeword is complete. If yes, then one iteration of decoding for this codeword is complete. If no, processing returns to step 406 for the next cyclic shift.

Figure 5:
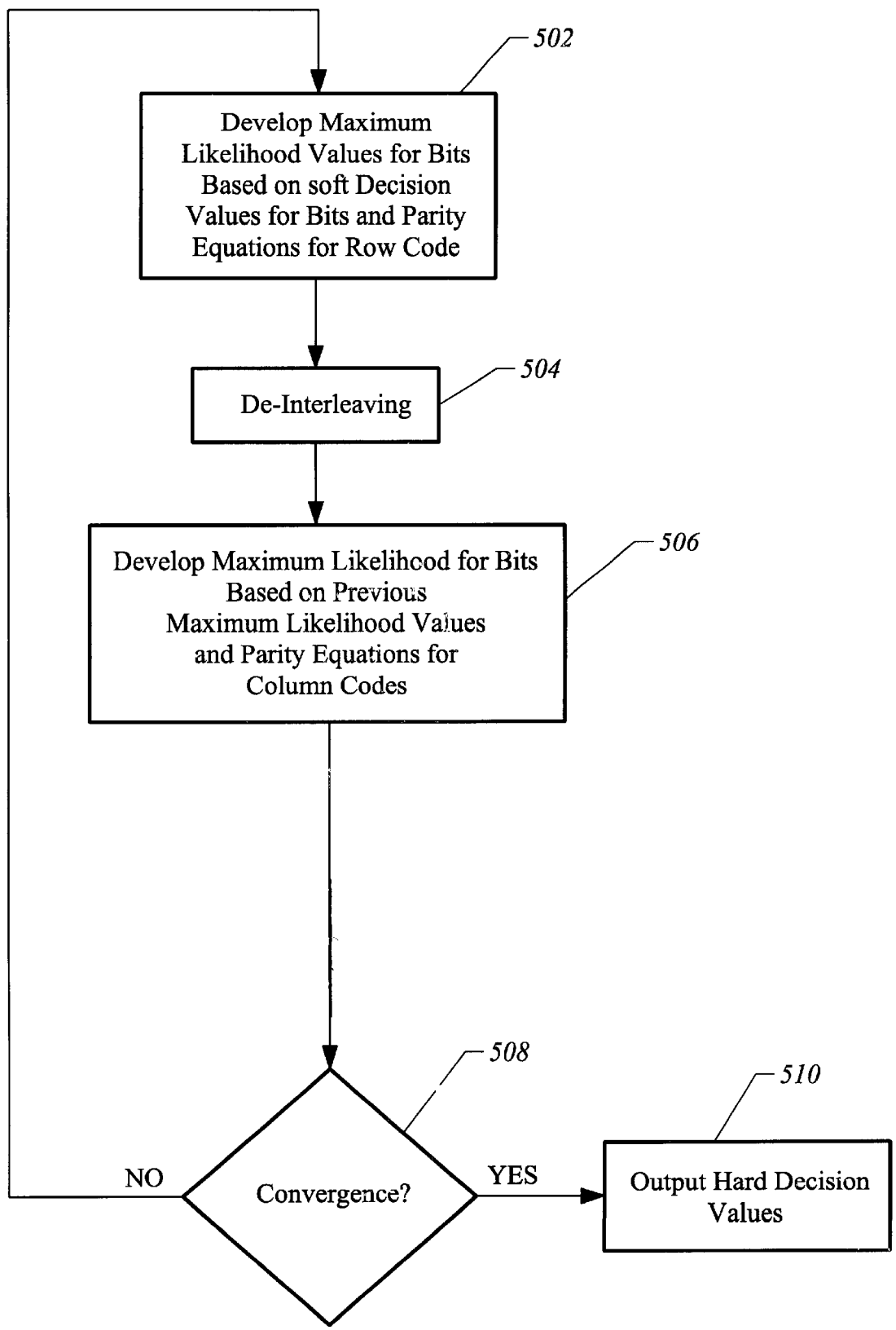
FIG. 5 depicts an iterative soft decision-in soft decision-out decoding procedure according to one embodiment of the present invention.

FIG. 5 is a flowchart depicting an iterative soft decision-in soft decision-out decoding procedure according to one embodiment of the present invention. FIG. 5 represents an overall procedure of which the above-described decoding techniques may represent a part. Step 502 represents decoding of a series of input bit soft decision values according to the first block coding scheme, e.g., a row code. The inputs to and outputs from step 502 are soft decision values for each codeword bit. The outputs may be generated by any of the techniques described above. The output values are subject to a de-interleaving step 504 which represents the inverse of the interleaving procedure applied by interleaver 204. The output of de-interleaving step 504 is again a series of soft decision values which are then the input to a decoding step 506. Step 506 decodes according to the second block coding scheme, e.g., a column code.

Each iteration of steps 502 and 506 generates new soft decision values for the data bits. One criterion for stopping the iterative process is convergence of the soft decision values. Convergence is tested at step 508. If the soft decision values are converging according to a numerical convergence criterion, then hard decision values are generated at step 510. In one embodiment, hard decision values may be generated simply by taking the sign of the log likelihood value for each bit. If the convergence criterion fails, processing returns to step 502 for further iteration. Other criteria are possible, such as, e.g., completion of a fixed number of iterations. In the context of block interleaving, the procedure of FIG. 5 can be understood with reference to FIG. 3 to consist of an alternating series of row decoding steps and column decoding steps.

It will of course be appreciated that, according to the present invention, these decoding techniques are easily extendable to serial combinations of more than two block codes.

Parallel Iterative Block Coding and Soft Decision-In Soft Decision-Out Decoding

Figure 6:
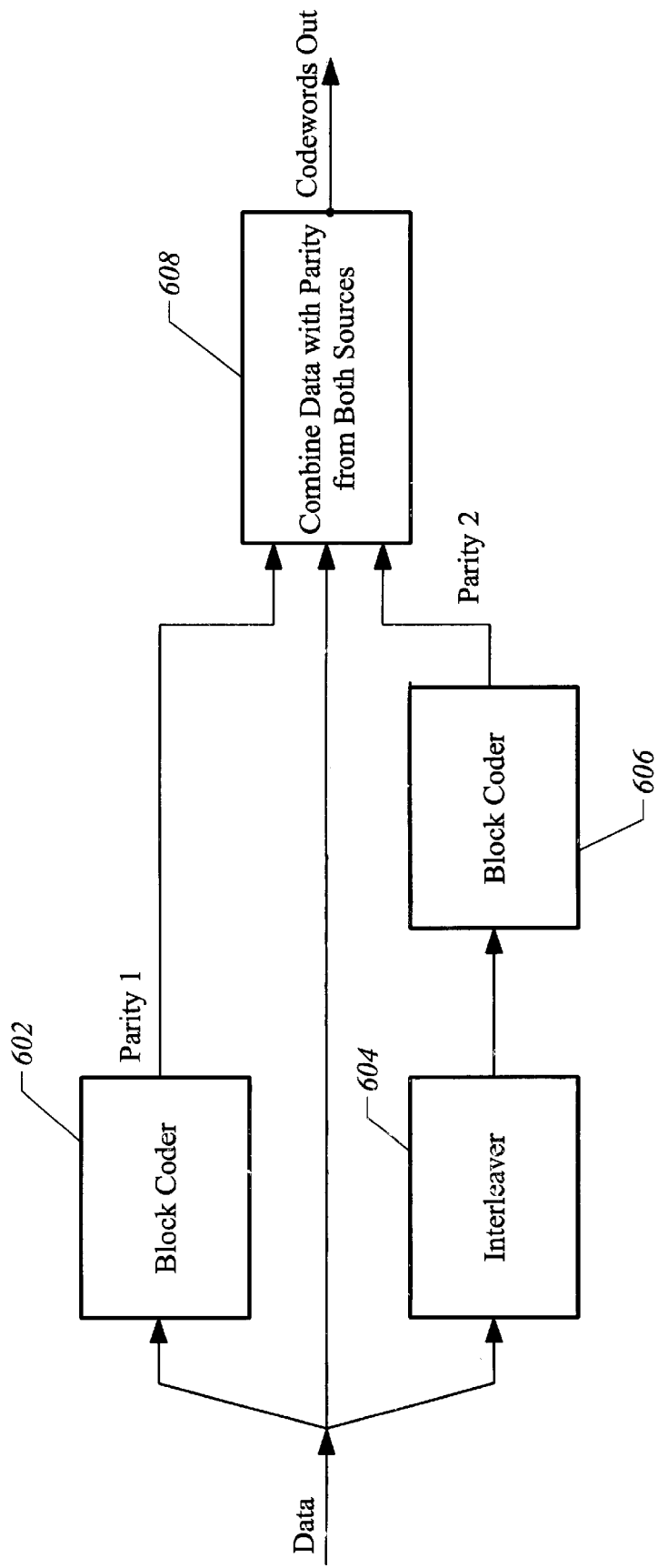
FIG. 6 depicts a parallel iterative block coder according to one embodiment of the present invention.

The decoding techniques described above may also be applied to parallel concatenated codes. FIG. 6 depicts a parallel iterative block coder according to one embodiment of the present invention. A first block coder 602 operates according to a first block coding scheme. The first block coding scheme is a systematic code so the effect is to produce one or more parity bits to correspond to a series of one or more data bits. The data input to block coder 602 is also fed to an interleaver 604. Choices of interleaving scheme include, e.g., block interleaving, helical interleaving, convolutional interleaving, and pseudo-random interleaving, etc. The output of interleaver 604 is fed into a second block coder 606 which operates according to a second block coding scheme. The second block coding scheme is also systematic and may or may not be the same as the first block coding scheme. Second block coder 606 also generates one or more parity bits. A combination element 608 combines the data bits with the parity bits generated by each block coder to form a series of codewords. Because the parity bits output by second block coder 606 will not be in sync with the original data bits, the output codewords generated by combination element 608 are significantly longer than the output codewords generated by either block coder individually.

Codewords generated in this way may be iteratively decoded according to any of the varations of soft decision input/soft decision output decoding scheme as described in reference to the serial iterative coder. For the parallel scheme, the set of parity bits exploited alternates with each iteration of steps 502 and 506 As with the serial iterative coding scheme, the parallel techniques may also be extended to more than two dimensions by adding further parallel lines of interleaver and block coder.

Soft Decision Values for Bits in Symbol-Based Systems

The decoding techniques above make use of soft decision values for individual bits. The first decoding iteration takes as an input bit soft decision values as would be generated by receiver signal processing element 110. In many communication and data storage systems, however, multi-bit symbols are communicated and the receiver output may be series of estimates for the values of these symbols. It is possible to decode on a symbol-by-symbol basis but the bit-based decoding techniques disclosed herein are simpler and less costly to implement.

Figure 7:
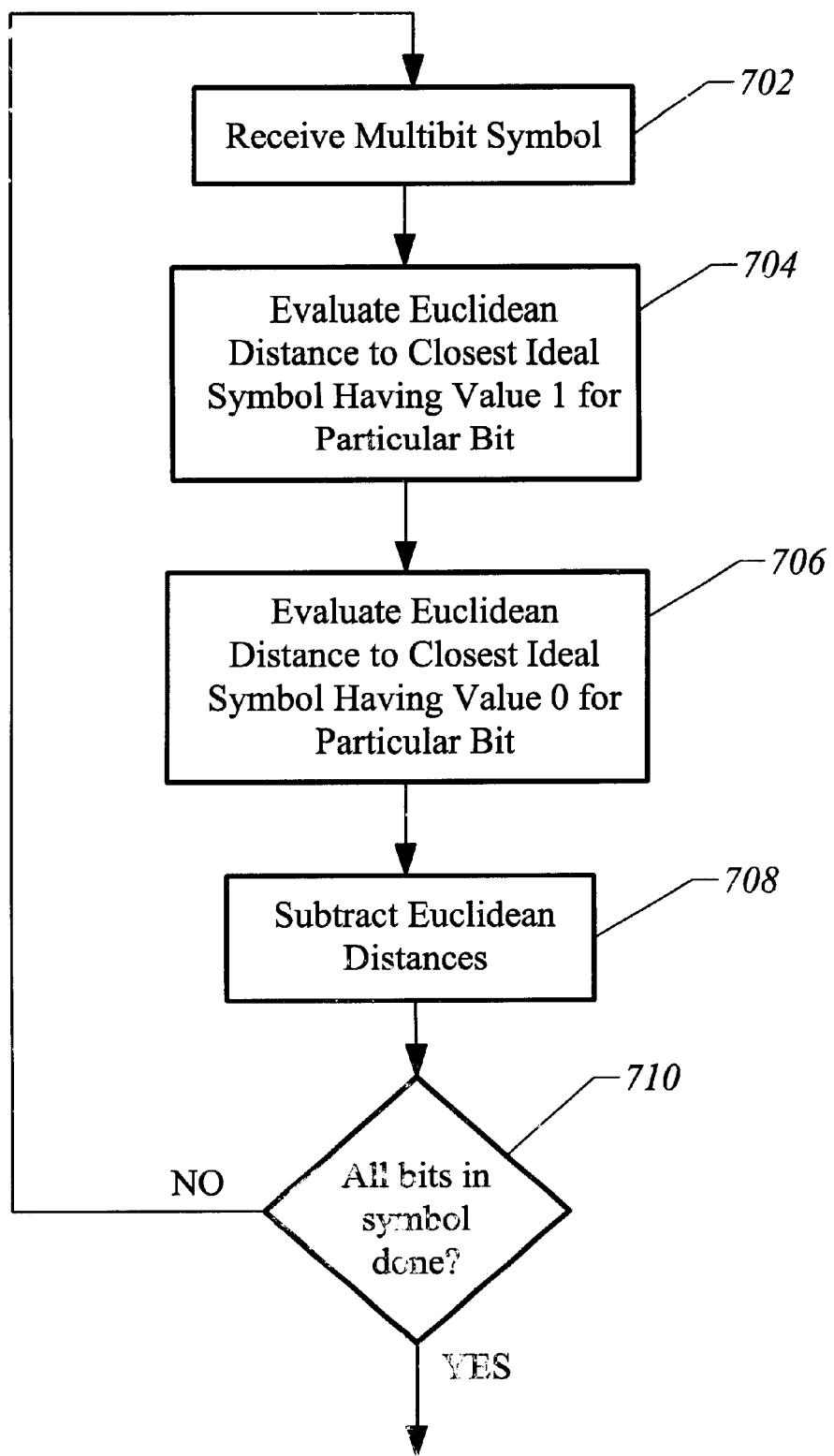
FIG. 7 depicts a procedure for obtaining soft decisions for received bits based on received symbol estimates according to one embodiment of the present invention.
Figure 8:
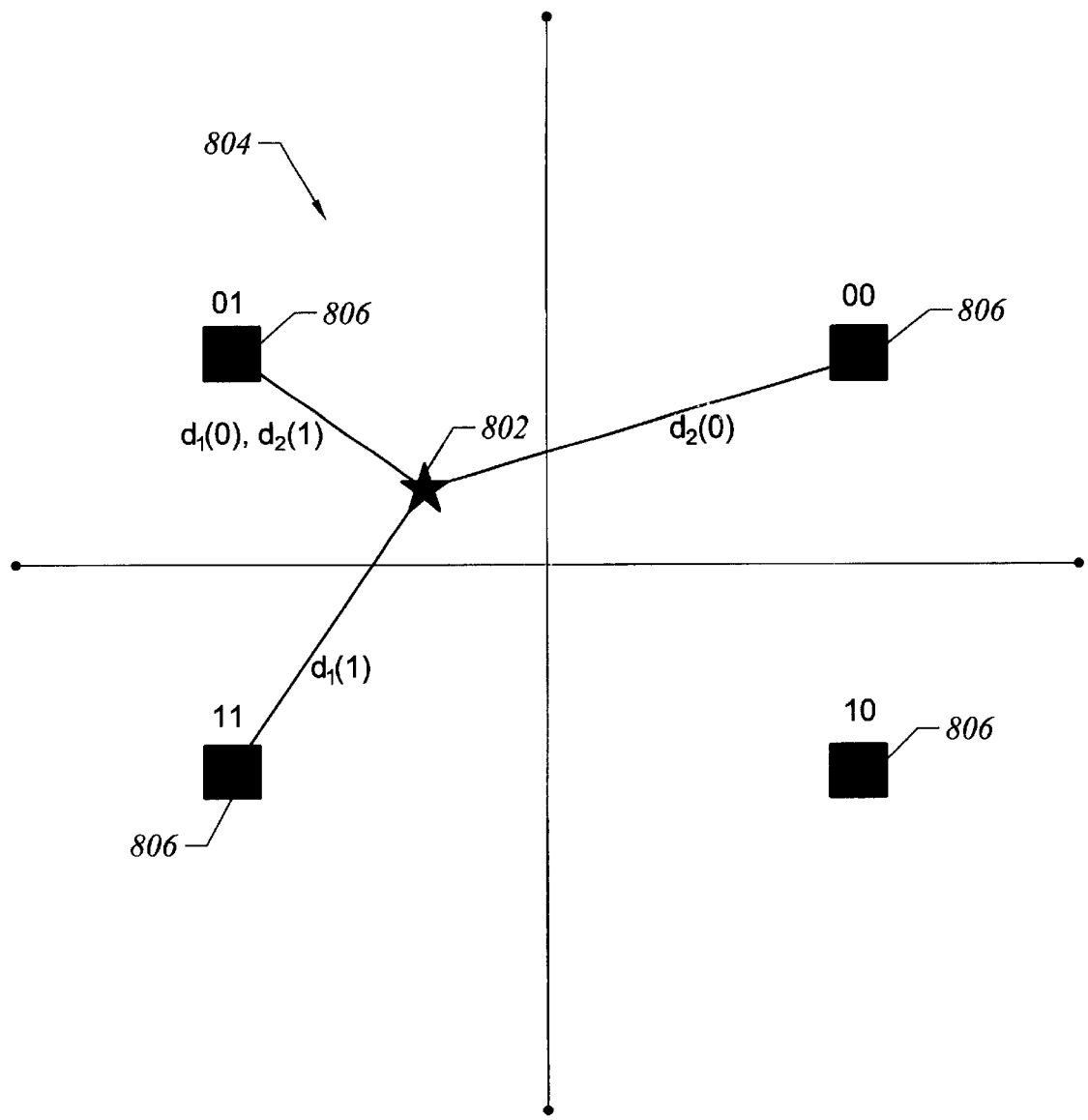
FIG. 8 depicts the use of Euclidean distances in the procedure of FIG. 7 according to one embodiment of the present invention.

According to the present invention, one may obtain soft decision values for individual bits based on received estimates of symbol values. FIG. 7 depicts a procedure for obtaining soft decisions for received bits based on received symbol estimates according to one embodiment of the present invention. FIG. 8 depicts the use of Euclidean distances in the procedure of FIG. 7 according to one embodiment of the present invention.

In FIG. 8, a received value for a two bit symbol is illustrated as a star 802 on a two-dimensional constellation 804. In constellation 804, there are four ideal symbol values 806 corresponding to the possible transmitted values of the symbol. Each ideal symbol value represents two bits as marked.

At step 702, the estimated symbol value is received. At step 704, the Euclidean distance to the nearest symbol having the value "1" for a particular bit is evaluated. For the left bit, this is distance $d_1(1)$ as shown in FIG. 8. At step 706, the Euclidean distance to the nearest symbol having the value "0" for this particular bit is evaluated. For the left bit, this is distance $d_1(0)$ as shown in FIG. 8. At step 708, the two Euclidean distances are subtracted to obtain an initial soft decision value for the particular bit. Step 710 tests whether soft decision values have been obtained for every bit in the symbol. If they have been obtained, the procedure is complete for that symbol. If they have not been, the procedure returns to step 702. For example, for the second bit of the received symbol in FIG. 8, the soft decision value will be the difference of the Euclidean distances $d_2(1)$ and $d_2(0)$ as shown.

Figure 9:
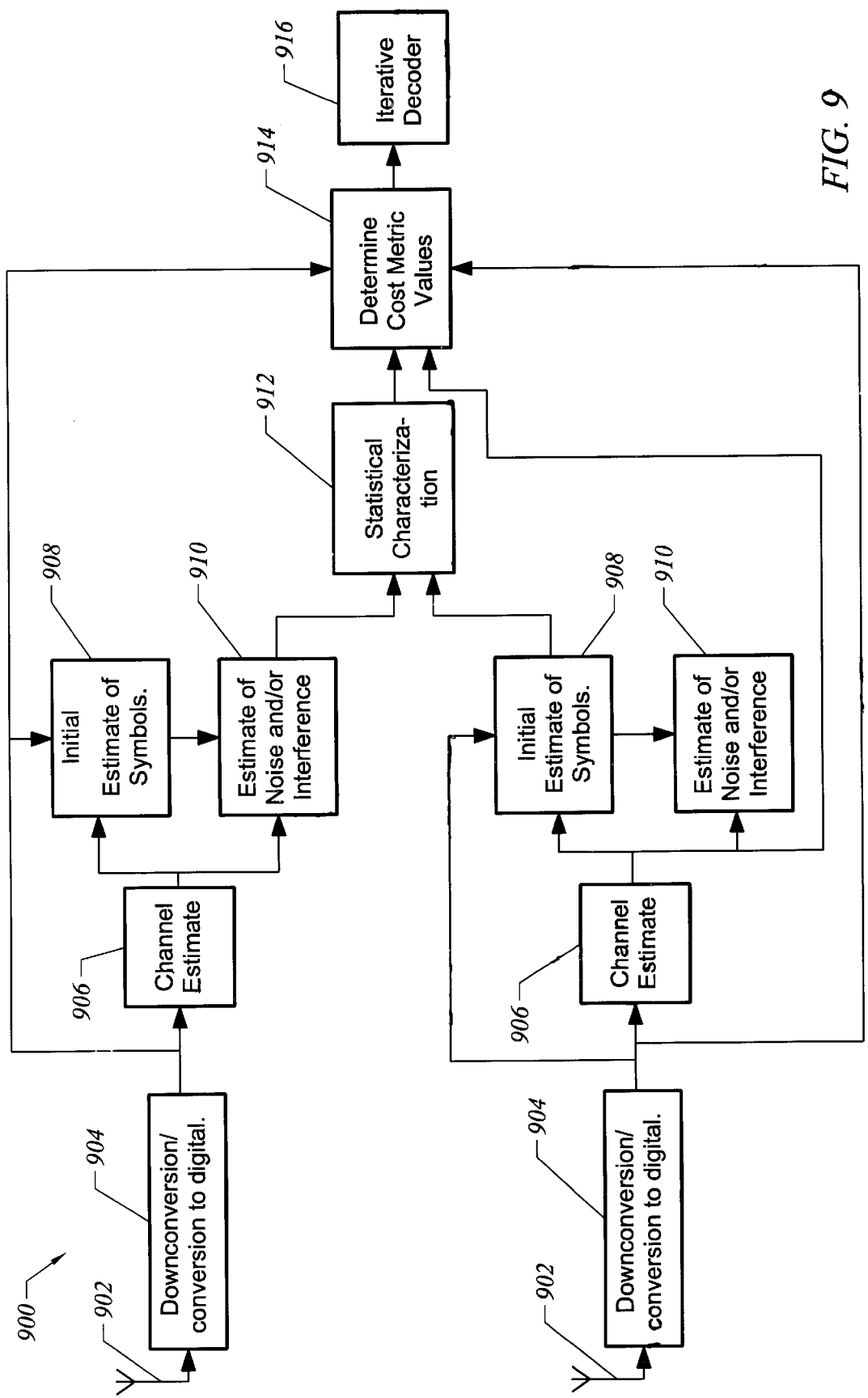
FIG. 9 depicts a system for exploiting multiple antennas in conjunction with iterative decoding procedures according to one embodiment of the present invention.

Furthermore, the soft decision decoding techniques may also be used in conjunction with a receiver system that employs multiple antennas or other multiple connections to the channel output. FIG. 9 depicts a receiver system 900 employing multiple antennas according to one embodiment of the present invention.

Receiver system 900 collects signals from a plurality of antennas 902. In FIG. 9, two antennas are shown, although any number of antennas may be used. Many components depicted in FIG. 9 are duplicated for each antenna.

Each antenna 902 is coupled to a downconversion system 904 which performs analog filtering, amplification, down-conversion to an intermediate frequency (IF), conversion to a digital baseband sample stream, and further digital filtering and conditioning. The output of each downconversion system 904 is a time domain symbol sequence.

Some of the transmitted symbols are training symbols that have predetermined values known at the receiver. Channel estimation processors 906 calculate the magnitude and phase of the channel response as measured via each antenna by comparing the known transmitted training symbol values and the actual values of the training symbols as received. Alternatively, the channel estimate may be based on feedback data obtained from the other side of the link.

Symbol estimation processors 908 form initial estimates of transmitted symbols, $\hat{z}_i(k)$, using the channel response estimates by applying the expression $$\hat{z}_i(k) = \frac{\hat{h}_i^*(k)x_i(k)}{\hat{h}_i^*(k)\hat{h}_i(k)}$$

where k is a frequency domain index, i identifies a particular antenna, $\hat{h}_i(k)$ is a channel response estimate based on signal received via channel output i, $x_i(k)$ represents a received symbol at time index k received via antenna i. These quantities are complex scalars. The effect of the symbol estimation processors 908 is to compensate for the known effect of the channel.

Noise and interference estimation blocks 910 form estimates of noise and interference according to the following expression:

$$\hat{w}_i(k)=x_i(k)-\hat{h}_i(k)\hat{z}_i(k).$$

In the absence of interference, noise will dominate this expression.

A statistical characterization block 912 estimates a statistical characterization of the received noise and interference and its distribution among the antennas. In one embodiment, it obtains a covariance matrix $R_W(k)$ that has $M_R \times M_R$ entries where $M_R$ is the number of receiver antennas. The i,jth entry of this covariance matrix is determined as $E[\hat{w}_i(k)\hat{w}^*_j(k)]$ where i and j identify individual antennas.

The E expectation operator may be evaluated over time. Smoothing may also be performed over time. A cost metric value processor 914 bases its generation of cost metric values on the following expression which gives a maximum likelihood soft decision value for each symbol:

$$\hat{z}(k)=v^*(k)x(k)$$

$$v(k) = \frac{R_w^{-1}(k)\hat{\underline{h}}(k)}{\hat{\underline{h}}^*(k)R_W^{-1}(k)\underline{h}(k)}$$

and where x(k) is a vector representing the time domain symbols received via all $M_R$ antennas and where $\hat{h}(k)$ is a vector representing the channel response estimates for all $M_R$ antennas.

Assuming that each symbol z(k) has m bits, a cost metric value processor estimates a soft metric cost value for each bit r at each time index value k to be:

$$c_{r,k}=[\hat{h}^*(k)R_W^{-1}(k)\hat{h}(k)][d_{r,k}^2(0)-d_{r,k}^2(1)]$$

where $d_{r,k}$ values are found from the soft decision symbol estimates using the procedure described in reference to FIGS. 7–8. An iterative decoder 916 may then apply any of the iterative decoding techniques described above to remove the effects of an iteratively applied convolutional code, e.g., a turbo code.

Spatial processing as described above may be simplified by assuming, e.g., that noise and/or interference is uncorrelated among the various receiver antennas, or further that noise and/or interference is not only spatially uncorrelated across antennas but also identically distributed. Simplifications based on these assumptions are disclosed in the co-assigned application entitled IMPROVED SYSTEM FOR INTERFERENCE CANCELLATION, U.S. application Ser. No. 09/234,629, the contents of which are herein incorporated by reference.

Conclusion

While the above is a complete description of preferred embodiments of the invention, there is alternatives, modifications, and equivalents may be used. It should be evident that the invention is equally applicable by making appropriate modifications to the embodiments described above. For example, the channel coding schemes herein may be combined in series with other channel coding schemes. Therefore, the above description should not be taken as limiting the scope of the invention that is defined by the meets and bounds of the appended claims along with their full scope of equivalents.

What is claimed is:

1. A signal processing system comprising:
   a receiver system that receives a series of codewords that have been coded according to an iterative block coding procedure; and
   a decoder that decodes said series of codewords according to an iterative decoding procedure wherein at least one iteration of said decoding procedure forms estimates of codeword bits based in part on at least two parity equations inherent to a block code employed in said iteratively applied block coding procedure.

2. The signal processing system of claim 1 wherein a first iteration of said iterative decoding procedure comprises:
   forming a soft decision value for a particular bit of a codeword by:
      receiving a multibit symbol including said particular bit as corrupted by communication via a channel;
      evaluating a first Euclidean distance between said multibit symbol and a closest ideal symbol for which said particular bit has value "1";
      evaluating a second Euclidean distance between said multibit symbol and a closest ideal symbol for which said particular bit has value "0"; and
      determining a soft decision value for said particular bit based on said first Euclidean distance and said second Euclidean distance.

3. The signal processing system of claim 2 wherein determining comprises obtaining a difference between said second Euclidean distance and said first Euclidean distance.

4. The signal processing system of claim 1 wherein said iterative block coding procedure comprises:
encoding according to a first block code to form a first series of codewords;
interleaving bits of said first series of codewords; and
encoding said interleaved bits according to a second block code to form a second series of codewords.

5. The signal processing system of claim 4 wherein interleaving comprises block interleaving.

6. The signal processing system of claim 4 wherein interleaving comprises helical interleaving.

7. The signal processing system of claim 4 wherein interleaving comprises pseudo-random interleaving.

8. The signal processing system of claim 4 wherein said first block code and said second block code are the same.

9. The signal processing system of claim 4 wherein said first block code and said second block code are different.

10. The signal processing system of claim 1 wherein said iterative block coding procedure comprises:
encoding a data bit stream according to a first block code to form a first stream of parity bits;
interleaving said bit stream;
encoding said interleaved bitstream according to a second block code to form a second stream of parity bits; and
combining said bit stream with said first stream of parity bits and said second series of parity bits to form a codeword stream.

11. The signal processing system of claim 10 wherein interleaving comprises block interleaving.

12. The signal processing system of claim 10 wherein interleaving comprises helical interleaving.

13. The signal processing system of claim 10 wherein interleaving comprises pseudo-random interleaving.

14. The signal processing system of claim 10 wherein said first block code and said second block code are the same.

15. The signal processing system of claim 10 wherein said first block code and said second block code are different.

16. A signal processing system comprising:
a receiver system that receives a series of codewords that have been coded according to an iteratively applied block coding procedure; and
a decoder that decodes said series of codewords according to an iterative decoding procedure wherein at least one iteration of said decoding procedure forms estimates of codeword bits based in part on estimates for at least two bits of a codeword, both of said estimates being based on a single parity equation for one of said bits.

17. The signal processing system of claim 16 wherein said at least one iteration forms estimates of all codeword bits based on cyclic shifting through a codeword and repeated application of said single parity equation.

18. A signal processing system comprising:
a receiver system that receives a series of codewords that have been coded according to an iteratively applied block coding procedure; and
a decoder that decodes said series of codewords according to an iterative decoding procedure wherein at least one iteration of said decoding procedure forms an estimate of at least one codeword bit based on a sum of a previously stored soft decision value for said at least one codeword bit and a weighted extrinsic value based on at least one parity equation.

19. The signal processing system of claim 18 wherein said weighted extrinsic value is based on at least two parity equations.

20. The signal processing system of claim 18 wherein at least two iterations of said decoding procedure form an estimate of at least one codeword bit based on a sum of a previously stored soft decision value for said at least one codeword bit and a weighted extrinsic value based on at least one parity equation, and wherein weighting of said extrinsic value varies per iteration.

21. A signal processing system comprising:
a receiver system that receives a series of codewords that have been coded according to an iteratively applied block coding procedure; and
a decoder that decodes said series of codewords according to an iterative decoding procedure wherein at least one iteration of said decoding procedure forms an estimate of at least one codeword bit based on a sum of a weighted previously stored soft decision value for said at least one codeword bit and a weighted extrinsic value based on at least one parity equation.

22. The signal processing system of claim 21 wherein said weighted extrinsic value is based on at least two parity equations.

23. The signal processing system of claim 22 wherein at least two iterations of said decoding procedure form an estimate of at least one codeword bit based on a sum of a weighted previously stored soft decision value for said at least one codeword bit and a weighted extrinsic value based on at least one parity equation, and wherein weightings for at least one of said previously stored soft decision value and said at least one parity equation vary per iteration.

24. A signal processing system comprising:
a receiver system that receives a series of codewords that have been coded according to an iteratively applied block coding procedure; and
a decoder that decodes said series of codewords according to an iterative decoding procedure wherein at least one iteration of said decoding procedure forms an estimate of at least one codeword bit based on a sum of a previously stored estimate for said at least one codeword bit and a weighted extrinsic value based on at least one parity equation.

25. The signal processing system of claim 24 wherein said weighted extrinsic value is based on at least two parity equations.

26. The signal processing system of claim 24 wherein at least two iterations of said decoding procedure form an estimate of at least one codeword bit based on a sum of a previously stored estimate for said at least one codeword bit and a weighted extrinsic value based on at least one parity equation, and wherein weighting of said extrinsic value varies per iteration.

27. A signal processing system comprising:
a receiver system that receives a series of codewords that have been coded according to an iteratively applied block coding procedure; and
a decoder that decodes said series of codewords according to an iterative decoding procedure wherein at least one iteration of said decoding procedure forms an estimate of at least one codeword bit based on a sum of a weighted previously stored estimate for said at least one codeword bit and a weighted extrinsic value based on at least one parity equation.

28. The signal processing system of claim 27 wherein said weighted extrinsic value is based on at least two parity equations.

29. The signal processing system of claim 27 wherein at least two iterations of said decoding procedure form an estimate of at least one codeword bit based on a sum of a weighted previously stored estimate for said at least one codeword bit and a weighted extrinsic value based on at least one parity equation, and wherein weightings for at least one of said previously stored estimate and said extrinsic value vary per iteration.

30. A method for estimating bit-by-bit soft decision value in a digital communication system where multibit symbols are communicated, the method comprising:

receiving a multibit symbol;

for a particular bit of said multibit symbol, evaluating a first Euclidean distance between said multibit symbol and a closest ideal symbol for which said particular bit has value "1";

evaluating a second Euclidean distance between said multibit symbol and a closest ideal symbol for which said particular bit has value "0";

determining a soft decision value for said particular bit based on said first Euclidean distance and said second Euclidean distance; and using said soft decision value as a basis for an iterative decoding process.

31. The method of claim 30 wherein determining comprises obtaining a difference between said second Euclidean distance and said first Euclidean distance.

32. The method of claim 30 wherein said multibit symbol has a value on a 2-dimensional constellation.

33. Apparatus for estimating bit-by-bit soft decision value in a digital communication system where multibit symbols are communicated, said apparatus comprising:

means for receiving a multibit symbol;

means for, for a particular bit of said multibit symbol, evaluating a first Euclidean distance between said multibit symbol and a closest ideal symbol for which said particular bit has value "1";

means for evaluating a second Euclidean distance between said multibit symbol and a closest ideal symbol for which said particular bit has value "0";

means for determining a soft decision value for said particular bit based on said first Euclidean distance and said second Euclidean distance; and means for using said soft decision value as a basis for an iterative decoding process.

34. The apparatus of claim 33 wherein said multibit symbol has a value on a 2-dimensional constellation.

* * * * *